(12) United States Patent
Iga

(10) Patent No.: US 6,304,507 B1
(45) Date of Patent: Oct. 16, 2001

(54) SEMICONDUCTOR STORAGE DEVICE

(75) Inventor: Hironori Iga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/599,657

(22) Filed: Jun. 21, 2000

(30) Foreign Application Priority Data

Jun. 21, 1999 (JP) ................................................ 11-173472

(51) Int. Cl.[7] ...................................................... G11C 7/02
(52) U.S. Cl. ........................... 365/208; 365/205; 365/207
(58) Field of Search ................................... 365/205, 207, 365/208, 190

(56) References Cited

U.S. PATENT DOCUMENTS

| | | | | |
|---|---|---|---|---|
| 5,220,527 | * | 6/1993 | Ohsawa | 365/149 |
| 5,323,345 | * | 6/1994 | Ohsawa | 365/207 |
| 6,009,032 | * | 12/1999 | Lin et al. | 365/208 |
| 6,104,655 | * | 8/2000 | Tanoi et al. | 365/205 |

FOREIGN PATENT DOCUMENTS 9-251782   9/1997   (JP).

* cited by examiner

Primary Examiner—Amir Zarabian
Assistant Examiner—Van Thu Nguyen
(74) Attorney, Agent, or Firm—McDermott, Will & Emery

(57) ABSTRACT

A semiconductor storage device which allows a differential sense amplifier to perform a normal amplifying operation even if a potential difference occurring in a pair of bit lines in readout of memory cell information is small. If a potential difference occurring in the pair of bit lines in readout of memory cell information is small, the differential sense amplifier can not normally perform an operation of amplifying. Adding in the differential amplification circuit DA, the inverting amplification circuit IA is newly provided and the differential amplification circuit DA is caused to operate after a very small potential difference occurring between the bit lines BL and /BL is amplified by the inverting amplification circuit IA.

6 Claims, 4 Drawing Sheets

SEMICONDUCTOR STORAGE DEVICE

BACKGROUND OF THE INVENTION

1. Field of the Invention

The present invention relates to a semiconductor storage device. In particular, the invention relates to a semiconductor storage device having a sense amplifier.

2. Description of Related Art

FIG. 4 is a circuit diagram showing a sense amplifier of a conventional semiconductor storage device. As shown in FIG. 4, the sense amplifier SA is connected to bit lines BL and /BL. The sense amplifier SA includes P-type MOS transistors PT1 and PT2 and N-type MOS transistors NT1 and NT2. A series connection of the P-type MOS transistor PT1 and the N-type MOS transistor NT1 is provided between nodes SP and SN. A series connection of the P-type MOS transistor PT2 and the N-type MOS transistor NT2 is also provided between the nodes SP and SN. The gates of the P-type MOS transistor PT1 and the N-type MOS transistor NT1 are connected to the bit line /BL and a node N2 that is located between the P-type MOS transistor PT2 and the N-type MOS transistor NT2. The gates of the P-type MOS transistor PT2 and the N-type MOS transistor NT2 are connected to the bit line BL and a node N1 that is located between the P-type MOS transistor PT1 and the N-type MOS transistor NT1.

Next, the operation of this sense amplifier SA will be described below with reference to a timing chart of FIG. 5. FIG. 5 shows a case where the pre-charging potential is (Vdd+Vss)/2, that is, the middle potential between a power source potential Vdd and a ground potential Vss and information stored in the memory cell is read out and the potential of the bit line BL thereby becomes higher than that of the bit line /BL by $\Delta V$. In a state that information stored in the memory cell has been read out to cause a potential difference $\Delta V$ between the bit lines BL and /BL, the potential of the node SN is decreased from (Vdd+Vss)/2 to the ground potential Vss. As a result, the N-type MOS transistors NT1 and NT2 are turned on. Since the potential of the bit line BL is higher than that of the bit line /BL, a current flowing through the N-type MOS transistor NT2 is larger that a current flowing through the N-type MOS transistor NT1. Therefore, the potential of the bit line /BL decreases toward the ground potential Vss and the current flowing through the N-type MOS transistor NT1 decreases. Therefore, the potential of the bit line BL decreases slightly and the potential difference between the bit lines BL and /BL increases.

Then, the potential of the node SP is increased from (Vdd+Vss)/2 to the power source potential Vdd. As a result, since the potential of the bit line /BL is lower than that of the bit line BL, a larger current flows through the P-type MOS transistor PT1 than the P-type MOS transistor PT2. Therefore, the potential of the bit line BL increases toward the power source potential Vdd. As the potential of the bit line BL increases, the current flowing through the P-type MOS transistor PT2 decreases. As a result, the potential difference between the bit lines BL and /BL is amplified to Vdd–Vss.

For a differential sense amplifier shown in FIG. 4 to perform a normal amplifying operation, the potential difference $\Delta V$ that occurs when information is read out from the memory cell should be larger than a certain value. Unless the memory cell capacitor has a large capacitance value, the potential difference $\Delta V$ does not become larger than the certain value. Therefore, the size of the memory call cannot be reduced unduly. This is one factor of preventing reduction of the chip area.

SUMMARY OF THE INVENTION

An object of the present invention is to provide a semiconductor storage device which allows a differential sense amplifier to perform a normal amplifying operation even if a potential difference occurring in a pair of bit lines in readout of memory cell information is small.

According to an aspect of the present invention, there is provided a semiconductor storage device comprising: an inverting amplification circuit which includes: a first inverting amplifier having an input and an output that are connected to a first node and a second node, respectively, for inverting-amplifying a potential at the first node and supplying an amplified potential to the second node; and a second inverting amplifier having an input and an output that are connected to the second node and the first node, respectively, for inverting-amplifying a potential at the second node and supplying an amplified potential to the first node; and a differential amplification circuit connected to the first node and second node, for amplifying a difference between the potentials at the first node and the second node as amplified by the inverting amplification circuit.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
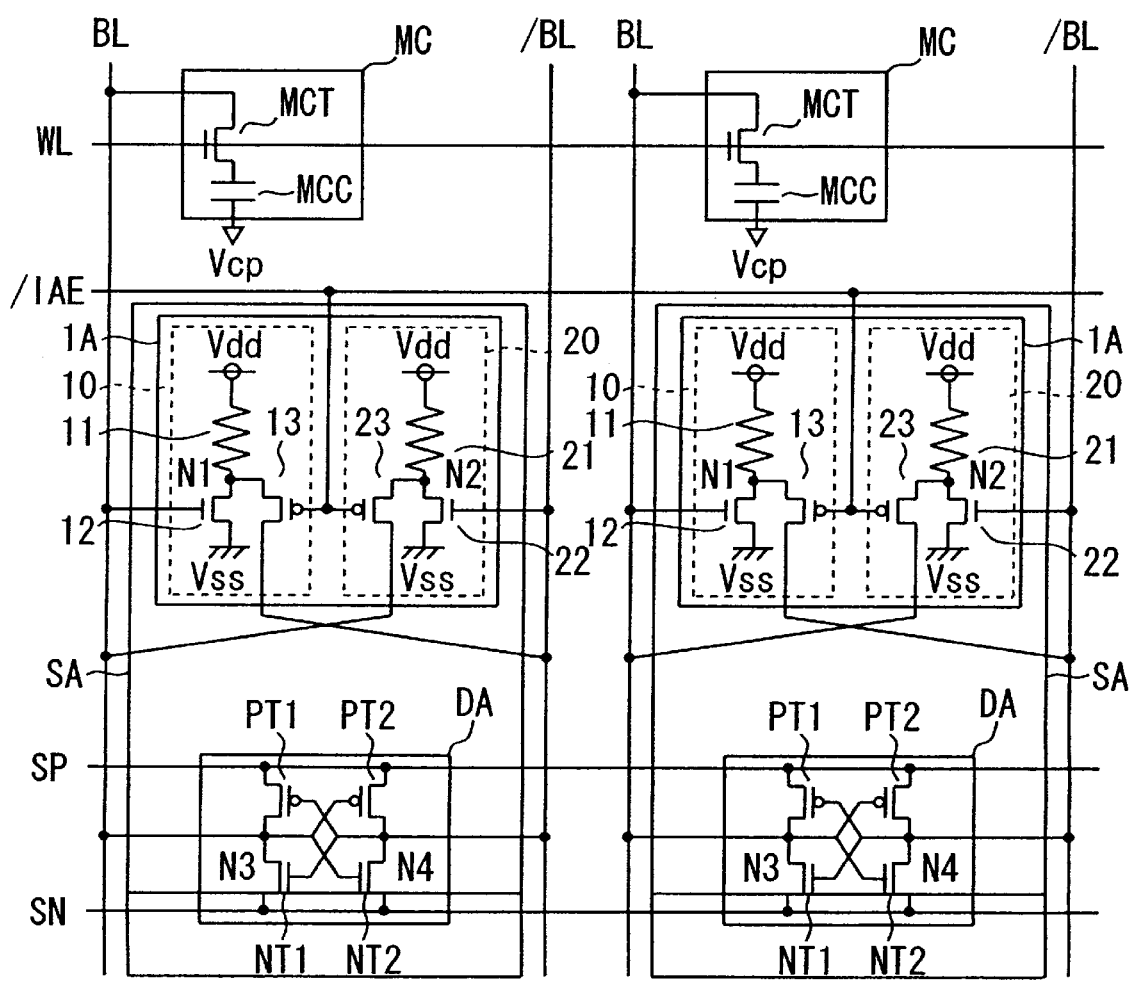
FIG. 1 is a circuit diagram showing part of the DRAM.

Embodiments of the present invention will be described below with reference to the accompanying drawings. It is noted that the same reference symbols in the drawings denote the same or corresponding components.

Embodiment 1

Figure 2:
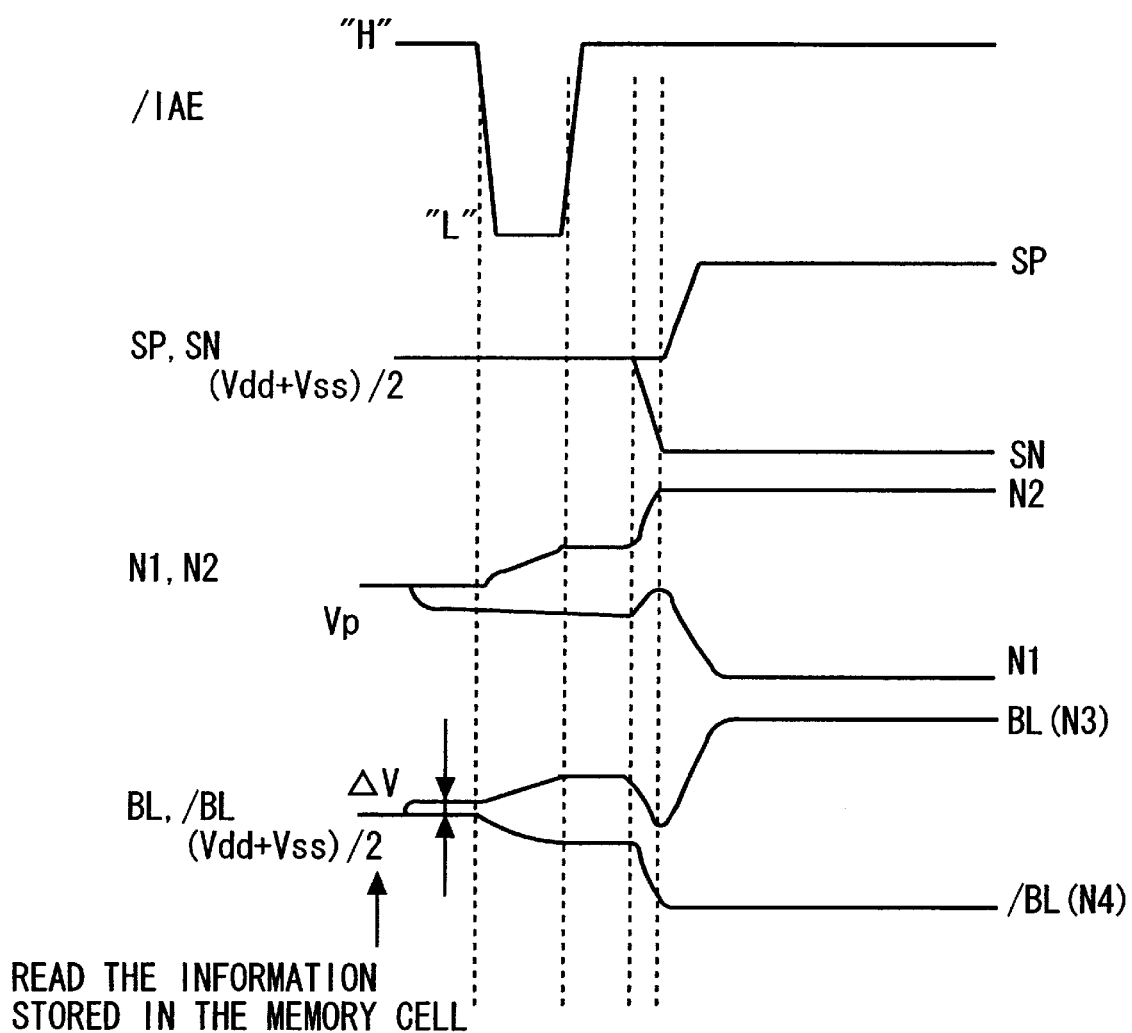
FIG. 2 shows a case where the pre-charging potential is (Vdd+Vss)/2.

A DRAM (Dynamic Random Access Memory) according to an embodiment of the present invention will be hereinafter described with reference to FIGS. 1 and 2. FIG. 1 is a circuit diagram showing part of the DRAM. As shown in FIG. 1, the DRAM has plural pairs of bit lines BL and /BL and a plurality of word lines WL. FIG. 1 shows only one word line WL as a representative one of those word lines WL. The DRAM has a plurality of memory cells MC that correspond to the respective intersecting points of the pairs of bit lines BL and /BL and the word lines WL. Each memory cell MC has a memory cell capacitor MCC and a memory cell transistor MCT that is connected to the memory cell capacitor MCC and any one of the bit lines BL and /BL configuring the corresponding pairs of bit lines. The middle potential (Vdd+Vss)/2 between a power source potential Vdd and a ground potential Vss is applied to one electrode of the memory cell capacitor MCC as a cell plate potential Vcp.

The DRAM also has a plurality of sense amplifiers SA that correspond to the respective pairs of bit lines BL and /BL. Each sense amplifier SA includes an inverting amplification circuit IA and a differential amplification circuit DA. The inverting amplification circuit IA includes an inverting amplifier 10 whose input and output are connected to nodes on the bit lines BL and /BL, respectively, and inverting-amplifies the potential at the bit line BL and supplies an amplified potential to the bit line /BL, and an inverting amplifier 20 whose input and output are connected to nodes on the bit; lines /BL and BL, respectively, and inverting-amplifies the potential at the bit line /BL and supplies an amplified potential to the bit line BL.

The inverting amplifier 10 includes a series connection of a resistance element 11 and an N-type MOS transistor 12 that are provided between a power source node to which the power source potential Vdd is applied and a ground node to which the ground potential Vss is applied. The gate of the N-type MOS transistor 12 is connected to the bit line BL. The inverting amplifier 10 also includes a P-type MOS transistor 13 that is provided between the drain of the N-type MOS transistor 12 and the bit line /BL and whose gate receives an inverting amplifier enabling signal /IAE. The potential at the bit line BL is inverting-amplified and an amplified potential appears at a node N1.

The inverting amplifier 20 includes a resistance element 21 and an N-type MOS transistor 22 that are connected between the power source node and the ground node. The gate of the N-type MOS transistor 22 is connected to the bit line /BL. The inverting amplifier 20 also includes an N-type MOS transistor 23 that is provided between the drain of the N-type MOS transistor 22 and the bit line BL and whose gate receives the inverting amplifier enabling signal /IAE. The potential at the bit line /BL is inverting-amplified and an amplified potential appears at a node N2.

The differential amplification circuit DA is connected to the bit lines BL and /BL and amplifies a potential difference between the bit lines BL and /BL as amplified by the inverting amplification circuit IA. The differential amplification circuit DA includes P-type MOS transistors PT1 and PT2 and N-type MOS transistors NT1 and NT2. A series connection of the P-type MOS transistor PT1 and the N-type MOS transistor NT1 is provided between nodes SP and SN. A series connection of the P-type MOS transistor PT2 and the N-type MOS transistor NT2 is also provided between the nodes SP and SN. The gates of the P-type MOS transistor PT1 and the N-type MOS transistor NT1 are connected to the bit line /BL and a node N2 that is located between the P-type MOS transistor PT2 and the N-type MOS transistor NT2. The gates of the P-type MOS transistor PT2 and the N-type MOS transistor NT2 are connected to the bit line BL and a node Ni that is located between the P-type MOS transistor PT1 and the N-type MOS transistor NT1.

The operation of DRAM will be described with reference to a timing chart of FIG. 2. FIG. 2 shows a case where the pre-charging potential is (Vdd+Vss)/2, that is, the middle potential between the power source potential Vdd and the ground potential Vss and information stored in the memory cell is read out and the potential of the bit line BL thereby becomes higher than that of the bit line /BL by $\Delta V$. First, until information stored in the memory cell MC is read out, the bit lines BL and /BL are pre-charged to the middle potential (Vdd+Vss)/2 and the node Ni is at a constant potential Vp that is determined by the resistance element 11 and the N-type MOS transistor 12. Since the inverting amplifiers 10 and 20 have the same characteristics, the nodes N1 and N2 are at the same constant potential Vp. Inverting amplifiers generally require a bias voltage. In this embodiment, the pre-charging potential is used as a bias voltage.

Then, the information stored in the memory cell MC is read out and the potential of the bit line BL becomes higher than (Vdd+Vss)/2 by $\Delta V$. As a result, the node N1 comes to have a potential that is lower than the potential Vp by $\Delta V$ multiplied by an amplification factor Ao, that is, Ao·$\Delta V$. That is, the potential difference $\Delta V$ between the bit lines BL and /BL as multiplied by the amplification factor Ao appears as a potential difference between the nodes N1 and N2. The amplification factor Ao is given by Ao=gm·R, where R is the resistance value of the resistance element 11, and gm is the transconductance of the N-type MOS transistor 12.

Then, the inverting amplifier enabling signal /IAE is changed from the high level (disabling level) to the low level (enabling level) and the P-type MOS transistors 13 and 23 are turned on. As a result, the potential Vp at the node N2 is conducted to the bit line BL and the potential Vp−Ao·$\Delta V$ at the node N1 is conducted to the bit line /BL. Receiving this potential at the bit line /BL, the inverting amplifier 20 increases the potential of the bit line BL to Vo+Ao$^2$·$\Delta V$ via the node N2. Receiving this increased potential at the bit line BL, the inverting amplifier 10 further decreases the potential of the bit line /BL via the node N1. The potential difference between the bit lines BL and /BL increases in this manner.

Figure 5:
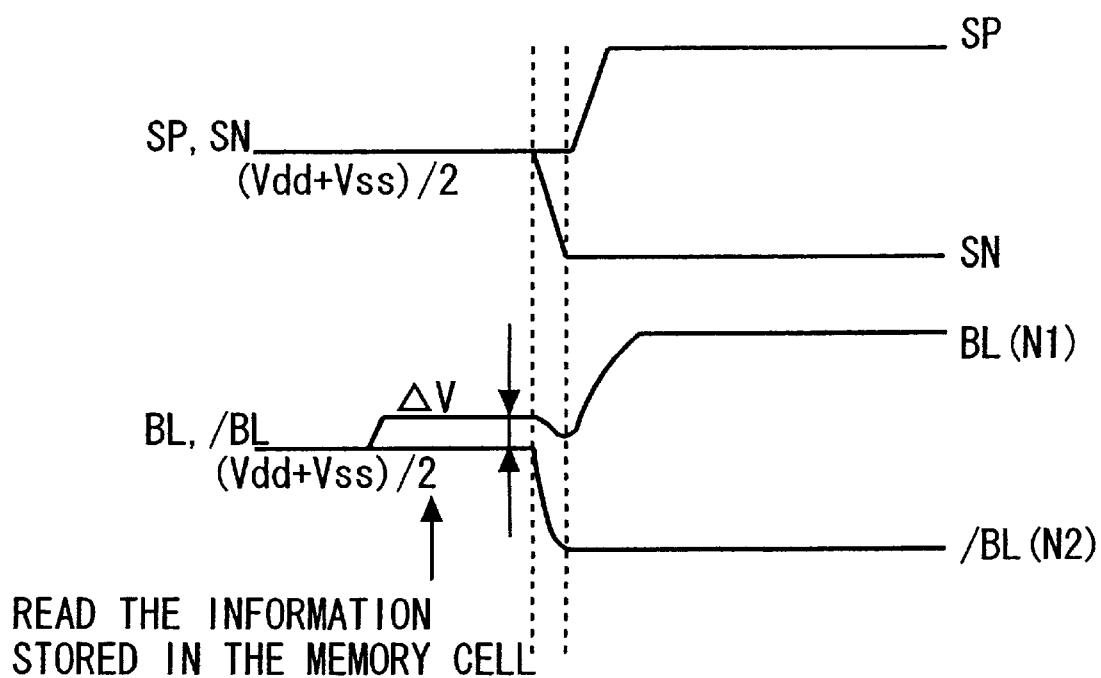
FIG. 5 shows a case where the pre-charging potential is (Vdd+Vss)/2.

However, only with the inverting amplification circuit IA, the increasing speed of the potential difference between the bit lines BL and /BL is slow. In view of this, when the potential difference between the bit lines BL and /BL has increased to such an extent that the differential amplification circuit DA can detect and amplify it normally, the inverting amplifier enabling signal/IAE is changed to the high level (disabling level) to turn off the P-type MOS transistors 13 and 23 and then the differential amplification circuit DA is caused to operate to amplify the potential difference. The operation of the differential amplification circuit DA is the same as the conventional sense amplifier SA that was described above with reference to FIG. 5.

As described above, in the DRAM according to the embodiment 1, the inverting amplification circuit IA is newly provided and the differential amplification circuit DA is caused to operate after a very small potential difference occurring between the bit lines BL and /BL is amplified by the inverting amplification circuit IA. Therefore, even if a potential difference occurring in the pair of bit lines in readout of memory cell information is small, the differential amplification circuit DA can normally perform an operation of detecting and amplifying it.

Embodiment 2

Figure 3:
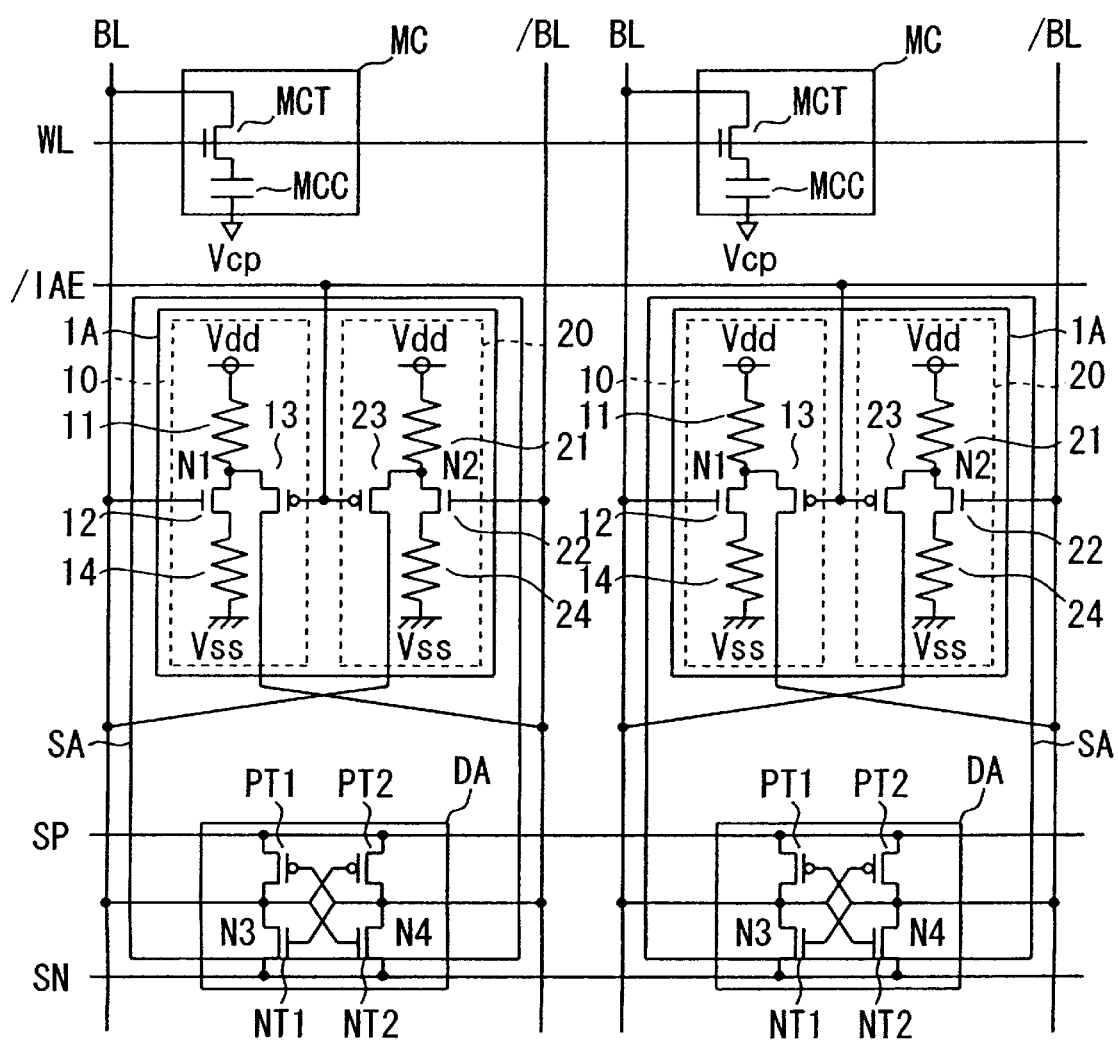
FIG. 3 shows a DRAM according to an embodiment 2 of the invention.
Figure 4:
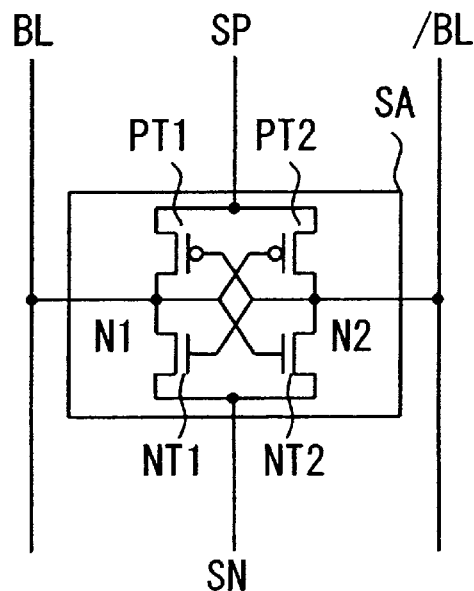
FIG. 4 is a circuit diagram showing a sense amplifier of a conventional semiconductor storage device.

A DRAM according to an embodiment 2 of the invention will be hereinafter described with reference to FIG. 3. The DRAM of the embodiment 2 is different from the DRAM of the embodiment 1 only in that the differential amplifier 10 further includes a resistance element 14 that is provided between the source of the N-type MOS transistor 12 and the ground potential node and that the differential amplifier 20 further includes a resistance element 24 that is provided between the source of the N-type MOS transistor 22 and the ground potential node. Other circuits are same as the DRAM of the embodiment 1.

In the configuration in which as mentioned above the resistance element 14 is provided between the N-type MOS transistor 12 and the ground potential node, the amplification factor of the inverting amplifier 10 is determined by only the resistance ratio between the resistance elements 11 and 14 and no longer depends on the transconductance of the N-type MOS transistor 12. The same is true of the inverting amplifier 20. Therefore, the embodiment 2 provides an advantage that the balance between the amplification factors of the inverting amplifiers 10 and 20 is not lost easily. Except for this point, the DRAM according the embodiment 2 operates in the same manner and provides the same advantages as the DRAM according to the embodiment 1.

Incidentally, the first and embodiment 2s are directed to the case where the invention is applied to a DRAM. When applied to ferroelectric memories such as an FeRAM, the invention is effective particularly in a case where the spontaneous polarization of a memory cell capacitor is deteriorated and thereby a potential difference between the bit lines is made small.

As described above, by virtue of the addition of the inverting amplification circuit, the invention provides the advantage that even if a potential difference occurring in the pair of bit lines in readout of memory cell information is small, the differential amplification circuit can normally perform an operation of detecting and amplifying the potential difference.

In the semiconductor storage device, the first inverting amplifier may comprise: a series connection of a first resistance element and a first transistor that is provided between a power source node to which a power source potential is applied and a ground node to which a ground potential is applied, a gate of the first transistor being connected to the first node; and a second transistor that is provided between a drain of the first transistor and the second node and receives an enabling signal at a gate thereof, and the second inverting amplifier comprises: a series connection of a second resistance element and a third transistor that is provided between the power source node and the ground node, a gate of the third transistor being connected to the second node; and a fourth transistor that is provided between a drain of the third transistor and the first node and receives the enabling signal at a gate thereof.

Here, the semiconductor storage device, the first inverting amplifier may further comprise a third resistance element that is provided between a source of the first transistor and the ground node, and the second inverting amplifier further comprises a fourth resistance element that is provided between a source of the third transistor and the ground node.

In the semiconductor storage device, the first and second inverting amplifiers may use a pre-charging voltage as a bias voltage.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-173472 filed on Jun. 21, 1999 including specification, claims, drawings and summary are incorporated herein by reference in its entirety.

What is claimed is:

1. A semiconductor storage device comprising:

an inverting amplification circuit which includes:
    a first inverting amplifier having an input and an output that are connected to a first node and a second node, respectively, for inverting-amplifying a potential at the first node and supplying an amplified potential to the second node; and
    a second inverting amplifier having an input and an output that are connected to the second node and the first node, respectively, for inverting-amplifying a potential at the second node and supplying an amplified potential to the first node; and
a differential amplification circuit connected to the first node and second node, for amplifying a difference between the potentials at the first node and the second node as amplified by said inverting amplification circuit.

2. The semiconductor storage device according to claim 1, wherein:

said first inverting amplifier comprises:
    a series connection of a first resistance element and a first transistor that is provided between a power source node to which a power source potential is applied and a ground node to which a ground potential is applied, a gate of the first transistor being connected to said first node; and
    a second transistor that is provided between a drain of the first transistor and said second node and receives an enabling signal at a gate thereof; and
said second inverting amplifier comprises:
    a series connection of a second resistance element and a third transistor that is provided between the power source node and the ground node, a gate of the third transistor being connected to said second node; and
    a fourth transistor that is provided between a drain of the third transistor and said first node and receives the enabling signal at a gate thereof.

3. The semiconductor storage device according to claim 2, wherein said first inverting amplifier further comprises a third resistance element that is provided between a source of said first transistor and said ground node, and said second inverting amplifier further comprises a fourth resistance element that is provided between a source of said third transistor and said ground node.

4. The semiconductor storage device according to claim 3, wherein said first and second inverting amplifiers use a pre-charging voltage as a bias voltage.

5. The semiconductor storage device according to claim 2, wherein said first and second inverting amplifiers use a pre-charging voltage as a bias voltage.

6. The semiconductor storage device according to claim 1, wherein said first and second inverting amplifiers use a pre-charging voltage as a bias voltage.

* * * * *